United States Patent
Ong (10) Patent No.: US 7,240,254 B2
(45) Date of Patent: Jul. 3, 2007

(54) MULTIPLE POWER LEVELS FOR A CHIP WITHIN A MULTI-CHIP SEMICONDUCTOR PACKAGE

(75) Inventor: Adrian E. Ong, Pleasanton, CA (US)

(73) Assignee: Inapac Technology, Inc, San Jose, CA (US)

( * ) Notice: Subject to any disclaimer, the term of this patent is extended or adjusted under 35 U.S.C. 154(b) by 233 days.

(21) Appl. No.: 10/877,687

(22) Filed: Jun. 25, 2004

(65) Prior Publication Data
US 2005/0024977 A1    Feb. 3, 2005

Related U.S. Application Data

(63) Continuation-in-part of application No. 10/824,734, filed on Apr. 15, 2004, which is a continuation of application No. 09/666,208, filed on Sep. 21, 2000, now Pat. No. 6,732,304.

(51) Int. Cl.
G11C 29/48    (2006.01)
G11C 29/12    (2006.01)

(52) U.S. Cl. ...................... 714/718; 714/763
(58) Field of Classification Search ............... 714/718, 714/763, 42, 54; 365/201; 710/31; 257/686; 361/694; 324/760; 702/118, 108
See application file for complete search history.

(56) References Cited

U.S. PATENT DOCUMENTS

| | | |
|---|---|---|
| 4,263,650 A | 4/1981 | Bennett et al. |
| 4,743,841 A | 5/1988 | Takeuchi |
| 4,773,028 A | 9/1988 | Tallman |
| 4,825,414 A | 4/1989 | Kawata |
| 4,873,669 A | 10/1989 | Furutani et al. |
| 5,151,881 A | 9/1992 | Kajigaya et al. |
| 5,251,095 A | 10/1993 | Miller et al. |
| 5,301,156 A | 4/1994 | Talley |
| 5,326,428 A | 7/1994 | Farnworth et al. |
| 5,388,104 A | 2/1995 | Shirotori et al. |
| 5,418,452 A | 5/1995 | Pyle |
| 5,457,400 A | 10/1995 | Ahmad et al. |
| 5,477,545 A | 12/1995 | Huang |
| 5,479,105 A | 12/1995 | Kim et al. |
| 5,506,499 A | 4/1996 | Puar |
| 5,523,697 A | 6/1996 | Farnworth et al. |
| 5,535,165 A | 7/1996 | David et al. |
| 5,594,694 A | 1/1997 | Roohparvar |
| 5,604,432 A | 2/1997 | Moore et al. |
| 5,619,461 A | 4/1997 | Roohparvar |
| 5,657,284 A | 8/1997 | Beffa |
| 5,677,885 A | 10/1997 | Roohparvar |
| 5,719,438 A | 2/1998 | Beilstein et al. |

(Continued)

Primary Examiner—Guy Lamarre
Assistant Examiner—Dipakkumar Gandhi
(74) Attorney, Agent, or Firm—Sidley Austin LLP (57) ABSTRACT

A semiconductor memory chip is provided for packaging along with a system chip in a single semiconductor package having a plurality of external connectors. The memory chip includes a memory storage array for storing data. A plurality of data buffers is provided for writing or reading data between said memory storage array and the system chip within the single semiconductor package. A first power level may be used for each of the plurality of data buffers. At least one test buffer is directly connected to certain of said plurality of external connectors for supporting testing of said memory chip within the single semiconductor package by external test equipment. A second power level may be used for the test buffer.

24 Claims, 8 Drawing Sheets

U.S. PATENT DOCUMENTS

| | | | |
|---|---|---|---|
| 5,751,015 A | 5/1998 | Corbett et al. | |
| 5,751,987 A * | 5/1998 | Mahant-Shetti et al. | 711/5 |
| 5,801,452 A | 9/1998 | Farnworth et al. | |
| 5,805,609 A | 9/1998 | Mote, Jr. | |
| 5,807,762 A | 9/1998 | Akram et al. | |
| 5,825,697 A | 10/1998 | Gilliam et al. | |
| 5,825,782 A * | 10/1998 | Roohparvar | 714/718 |
| 5,923,600 A | 7/1999 | Momohara | |
| 5,925,142 A | 7/1999 | Raad et al. | |
| 5,936,260 A | 8/1999 | Corbett et al. | |
| 5,959,310 A | 9/1999 | Akram et al. | |
| 5,966,388 A | 10/1999 | Wright et al. | |
| 5,995,379 A | 11/1999 | Kyougoku et al. | |
| 6,011,720 A | 1/2000 | Tanaka | |
| 6,026,039 A | 2/2000 | Kim et al. | |
| 6,047,393 A | 4/2000 | Yamada | |
| 6,069,483 A | 5/2000 | Maxwell et al. | |
| 6,072,326 A | 6/2000 | Akram et al. | |
| 6,087,676 A | 7/2000 | Akram et al. | |
| 6,100,708 A | 8/2000 | Mizuta | |
| 6,100,716 A * | 8/2000 | Adham et al. | 326/68 |
| 6,104,658 A | 8/2000 | Lu | |
| 6,137,167 A | 10/2000 | Ahn et al. | |
| 6,154,860 A | 11/2000 | Wright et al. | |
| 6,157,046 A | 12/2000 | Corbett et al. | |
| 6,188,232 B1 | 2/2001 | Akram et al. | |
| 6,191,603 B1 | 2/2001 | Muradali et al. | |
| 6,194,738 B1 | 2/2001 | Debenham et al. | |
| 6,208,157 B1 | 3/2001 | Akram et al. | |
| 6,216,241 B1 | 4/2001 | Fenstermaker et al. | |
| 6,243,839 B1 | 6/2001 | Roohparvar | |
| 6,243,840 B1 | 6/2001 | Raad et al. | |
| 6,263,463 B1 | 7/2001 | Hashimoto | |
| 6,274,937 B1 | 8/2001 | Ahn et al. | |
| 6,286,115 B1 | 9/2001 | Stubbs | |
| 6,294,839 B1 | 9/2001 | Mess et al. | |
| 6,298,001 B1 | 10/2001 | Lee et al. | |
| 6,300,782 B1 | 10/2001 | Hembree et al. | |
| 6,310,484 B1 | 10/2001 | Akram et al. | |
| 6,320,201 B1 | 11/2001 | Corbett et al. | |
| RE37,611 E | 3/2002 | Roohparvar | |
| 6,365,421 B2 | 4/2002 | Debenham et al. | |
| 6,366,487 B1 | 4/2002 | Yeom | |
| 6,392,948 B1 | 5/2002 | Lee | |
| 6,395,565 B1 | 5/2002 | Akram et al. | |
| 6,396,291 B1 | 5/2002 | Akram et al. | |
| 6,407,566 B1 | 6/2002 | Brunelle et al. | |
| 6,441,479 B1 | 8/2002 | Ahn et al. | |
| 6,445,625 B1 | 9/2002 | Abedifard | |
| 6,456,099 B1 | 9/2002 | Eldridge et al. | |
| 6,470,484 B1 | 10/2002 | Day et al. | |
| 6,472,747 B2 | 10/2002 | Bazarjani et al. | |
| 6,483,760 B2 | 11/2002 | Kang | |
| 6,484,279 B2 | 11/2002 | Akram | |
| 6,502,215 B2 | 12/2002 | Raad et al. | |
| 6,507,885 B2 | 1/2003 | Lakhani et al. | |
| 6,519,171 B2 | 2/2003 | Matsuzaki et al. | |
| 6,519,725 B1 | 2/2003 | Huisman et al. | |
| 6,732,304 B1 * | 5/2004 | Ong | 714/718 |
| 6,791,175 B2 | 9/2004 | Matsuo et al. | |
| 6,801,461 B2 | 10/2004 | Hii et al. | |
| 6,996,754 B1 | 2/2006 | Lee | |
| 2002/0117729 A1 | 8/2002 | Aiki et al. | |
| 2004/0232559 A1 | 11/2004 | Adelmann | |

* cited by examiner

MULTIPLE POWER LEVELS FOR A CHIP WITHIN A MULTI-CHIP SEMICONDUCTOR PACKAGE

CROSS-REFERENCE TO RELATED APPLICATION AND CLAIM OF PRIORITY

The present application is a continuation-in-part of, and claims the benefit of priority to, co-pending U.S. patent application Ser. No. 10/824,734, filed on Apr. 15, 2004, entitled "Chip Testing Within A Multi-Chip Semiconductor Package," which is a continuation of Ser. No. 09/666,208 filed Sep. 21, 2000, now U.S. Pat. No. 6,732,304, filed on Sep. 21, 2000, entitled "Chip Testing Within A Multi-Chip Semiconductor Package," the entirety of which are both incorporated by reference herein.

BACKGROUND OF THE INVENTION

1. Field of the Invention

The present invention relates generally to the testing of semiconductor devices and, more particularly, multiple power levels for a chip within a multi-chip packaged semiconductor device.

2. Related Art

Semiconductor devices have continually evolved to provide improvements such as miniaturization, increased speed, reduced power consumption, and reduced cost. As an example, memory is an essential part of an electronic system because it stores information required by the system, such as computational instructions, preliminary calculation data, temporary data, and various other data. Current semiconductor or integrated circuit (IC) memory devices can store large amounts of data in relatively small packages. Exemplary IC memory devices include random access memory (RAM) devices such as static RAM (SRAM), dynamic RAM (DRAM), non-volatile RAM (NVRAM), and read only memory (ROM) devices such as programmable ROM (PROM), erasable programmable ROM (EPROM), electrically erasable programmable ROM (EEPROM), and flash memory.

Figure 1:
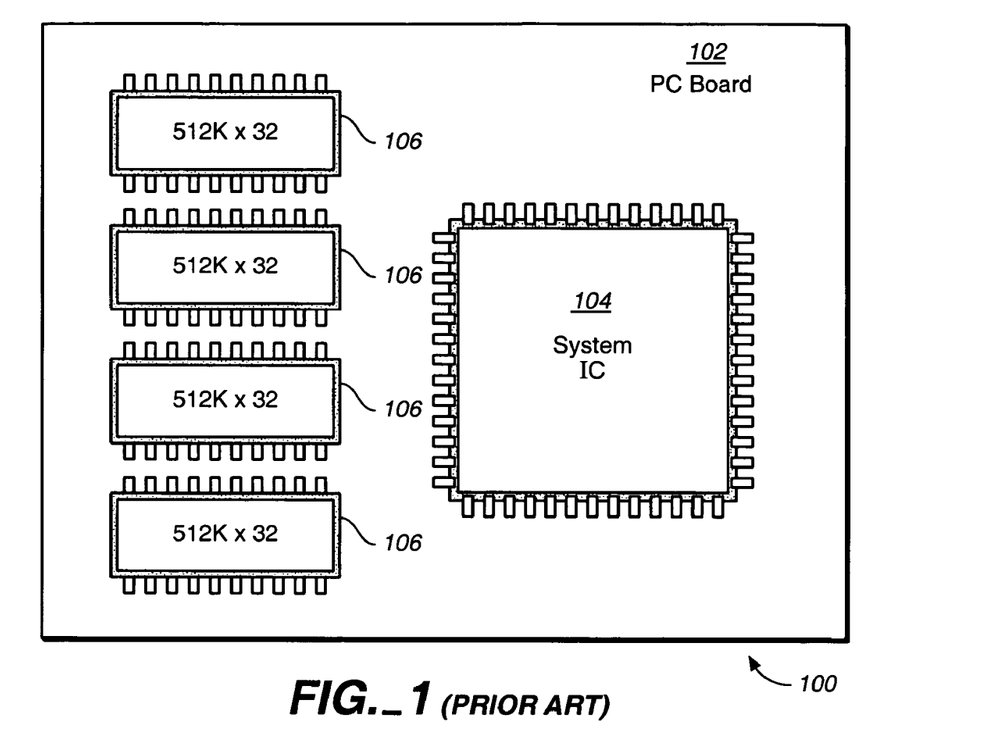
FIG. 1 is a block diagram of a conventional electronic system.

FIG. 1 illustrates a conventional electronics system 100 comprising a printed circuit (PC) board 102, a system IC 104, and a number of memory devices 106. PC board 102 may be a layered dielectric structure with internal and external wiring that allows system IC 104 and memory devices 106 to be mechanically supported and electrically connected internally to each other and to outside circuits and systems. Memory devices 106 are discrete ICs such as four DRAM ICs of 512 kilobits (Kb) by 32 bits, which may be combined to provide 512 Kb by 128 bits. System IC 104 may comprise, for example, a microprocessor or an application specific integrated circuit (ASIC) that utilizes memory devices 106 to store information. Each of memory devices 106 and system IC 104 may be separately packaged in a suitable package formed of polymer or ceramic and having a plurality of input/output (I/O) pins for connection to PC board 102.

The arrangement of system 100 provides certain advantages, such as ready testing of system IC 104 and memory devices 106 prior to their connection to PC board 102 and easy removal and replacement of faulty discrete components. However, system 100 can be relatively large and may require more space than is available for many types of electronic devices such as cellular telephones, laptops, and personal digital assistants.

Figure 2:
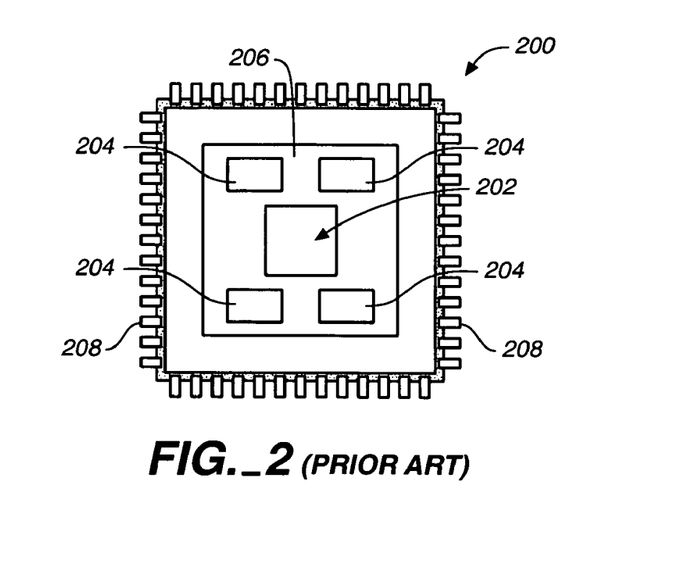
FIG. 2 is a block diagram of a conventional multi-chip module.

FIG. 2 is a block diagram of a conventional multi-chip module (MCM) 200 that integrates a number of raw chips (i.e., the silicon containing the integrated circuit—also referred to as a "die") into a single semiconductor device. MCM 200 comprises a system chip 202 and a number of memory chips 204 on a substrate 206. System chip 202 and memory chips 204 may correspond functionally to system IC 104 and memory devices 106, respectively, of FIG. 1, but are provided within a single, discrete package. Relative to system 100, MCM 200 provides certain advantages, such as a reduction in the amount of space required for implementation and an increase in processing speeds due to shorter leads between chips.

A multi-chip packaged semiconductor device may be viewed in terms of primary and secondary chips. A primary chip has direct access to external connectors of the multi-chip package and can communicate or convey information directly through these external connectors to components or devices external to the multi-chip package. For example, a primary chip may comprise an application specific integrated circuit (ASIC) controller or microprocessor that performs the main system functions of the multi-chip package. System chip 202 would also be an example of a primary chip.

A secondary chip generally does not have direct access to external connectors and typically is utilized in concert with the primary chip to assist or enhance the primary chip's performance or functionality. For example, a secondary chip may comprise a memory subsystem, co-processor subsystem, analog subsystem, or other application-type specific subsystem. Memory chips 204 would also be an example of secondary chips. Thus, secondary chips generally are not able to "talk" or communicate directly through external connectors.

A drawback of conventional multi-chip packaged semiconductor devices, such as MCM 200, is that it does not allow complete testing of the secondary chips once they are incorporated into the package. For example, in MCM 200, memory chips 204 are connected to system chip 202, with system chip 202 connected to a number of I/O pins 208 of MCM 200. No direct connections are available between memory chips 204 and external test equipment and, thus, a stringent final test of memory chips 204 within MCM 200 is not possible.

Typically, prior to packaging for an MCM, chips are tested using known good die (KGD) technology. There are various levels of KGD technology for die testing. These levels range from wafer level functional and parametric testing (i.e., wafer sort tests) to dynamic burn-in with full testing that continually tests the die while at high temperatures. The more a die is tested, the more likely an assembled MCM will function properly.

However, even the most rigorous die testing prior to assembly will not guarantee that the assembled MCM will function as desired. For example, some chips may become damaged during assembly (i.e., after die testing) or the die connections may be faulty within the MCM.

With regard to MCM 200, although is possible to test memory chips 204 by transferring data through other chips (e.g., system chip 202), this type of testing fails to detect all of the various types of memory failures. Specifically, external integrated circuit test equipment does not have direct access to the secondary chips because there are no pin-outs or other direct connections, because secondary chips interface through the primary chips. Consequently, a number of MCM failures are the result of integrated circuit chips that have not been fully tested. Often, these failures are not discovered until after incorporation into an electronic device, which adds to the cumulative cost of the defective MCM, not only for the MCM manufacturer, but also for their customers whose products fail to function properly due to the defective MCM. Thus, for complete testing and for quality and reliability reasons, direct access to secondary chips is required.

As a result, there is a clear need for a system and method to test one or more chips of a multi-chip semiconductor package after integration into the chip packaging (e.g., MCM packaging).

SUMMARY OF THE INVENTION

The present invention provides a system and method that provides complete testing of one or more secondary chips within a multi-chip semiconductor device.

In accordance with an embodiment of the present invention, a semiconductor memory chip is provided for packaging along with a system chip in a single semiconductor package having a plurality of external connectors. The memory chip includes a memory storage array for storing data. A plurality of data buffers is provided for writing or reading data between said memory storage array and the system chip within the single semiconductor package. A first power level may be used for each of the plurality of data buffers. At least one test buffer is directly connected to certain of said plurality of external connectors for supporting testing of said memory chip within the single semiconductor package by external test equipment. A second power level may be used for the test buffer.

In accordance with another embodiment of the present invention, a packaged semiconductor device includes a plurality of external connectors for a semiconductor package. A primary chip, disposed within the semiconductor package, is connected to at least a portion of said plurality of external connectors. A secondary chip, also disposed within the semiconductor package, is connected to said primary chip. The secondary chip includes a plurality of data signal drivers for transferring information between said secondary chip and said primary chip during a normal mode of operation. A first power level may be used for each of the plurality of data signal drivers. At least one test signal driver is directly connected to certain of said portion of said plurality of external connectors to provide testing of said secondary chip during a test mode of operation and while contained within the semiconductor package. A second power level is may be for the test signal driver.

In accordance with another embodiment of the present invention, a semiconductor chip is provided for incorporation as a secondary chip into a multi-chip packaged semiconductor device. The semiconductor chip includes at least one data buffer operable to connect to a primary chip incorporated into the multi-chip packaged semiconductor device for receiving from and outputting signals to the primary chip during a normal mode of operation. A first power level may be used for each of the plurality of data buffers. A test buffer is operable to directly connect to an external terminal of the multi-chip packaged semiconductor device for receiving from and outputting signals to external testing circuitry during a test mode of operation. A second power level may be used for the test buffer.

A more complete understanding of the system and method for testing a secondary chip within a multi-chip packaged semiconductor device will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE INVENTION

The embodiments of the present invention and their advantages are best understood by referring to FIGS. 1 through 11 of the drawings. Like numerals are used for like and corresponding parts of the various drawings.

The present invention, in various embodiments, provides systems and methods for testing one or more secondary chips within a multi-chip packaged semiconductor device. The secondary chip may comprise any type of chip that lacks sufficient connections to external pins or terminals of the multi-chip package to allow complete testing of the secondary chip. For example, a secondary chip may comprise a memory subsystem, a co-processor subsystem, an analog subsystem, or other application-type specific subsystem. A secondary chip comprised of a memory chip is selected as an exemplary application in accordance with an embodiment of the present invention and described in detail below. However, it should be understood that the principles of the present invention are applicable for other types of secondary chips within a semiconductor package and are not limited to exemplary embodiments described herein.

Figure 3:
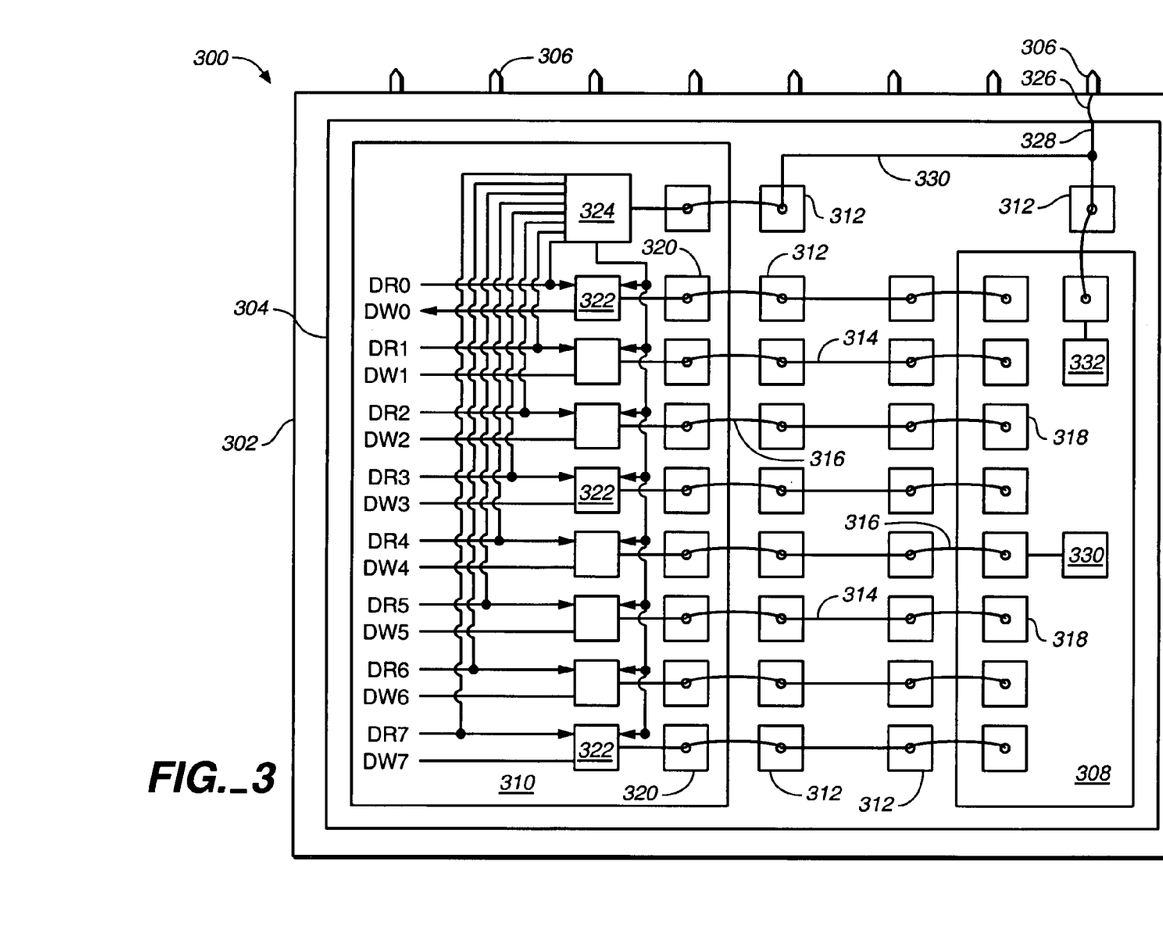
FIG. 3 is a block diagram illustrating a multi-chip module 15 in accordance with an embodiment of the present invention.

FIG. 3 is a block diagram illustrating a multi-chip module (MCM) 300 in accordance with an embodiment of the present invention. MCM 300 comprises a chip package 302 having a number of input/output (I/O) pins or terminals 306, and containing a substrate 304 upon which a system chip 308 and a memory chip 310 are mounted. As such, MCM 300 may constitute a multi-chip semiconductor package i.e., a semiconductor device having multiple chips or dies contained within a single package. System chip 308 may comprise, for example, a processor, a microprocessor, a microcontroller, a field programmable gate array, an ASIC, or any other type of chip or logic device that may communicate with a memory chip. Memory chip 310 may comprise any type of memory such as, for example, random access memory (RAM) devices or read only memory (ROM) devices including static RAM (SRAM), dynamic RAM (DRAM), non-volatile RAM (NVRAM), programmable ROM (PROM), erasable programmable ROM (EPROM), electrically erasable programmable ROM (EEPROM), and flash memory.

System chip 308 is shown as having a number of bonding pads 318 and bonding wires 316 which facilitate connections to substrate bonding pads 312 on substrate 304 and allow communication of information between system chip 308 and other chips or components within or external to MCM 300. For example, system chip 308 communicates with memory chip 310 utilizing bonding pads 318, bonding wires 316, traces 314, and memory bonding pads 320. System chip 308 also communicates with components outside of MCM 300 utilizing one or more connections such as through bonding pad 318, bonding wire 316, substrate bonding pad 312, trace 328, lead wire 326, and terminal 306. Many other types of connections are possible between system chip 308 and memory chip 310 and between system chip 308 and terminals 306, but those shown in FIG. 3 are illustrative of the basic connections. For example, the connections between memory chip 310 and system chip 308 may represent a common memory bus utilizing a four-layer substrate, with separate power supply planes for each chip. System chip 308 may also have one or more input/output buffers or driver circuits 330 and 332 for receiving and driving the signals on the bonding pads 318. As shown, buffer 330 is used for communicating from die to die within MCM 300, and buffer 332 is used for communicating with external components.

In one embodiment, system chip 308 may use different voltage levels for communicating with memory chip 310 (i.e., from die-to-die within MCM 300) versus communicating with components outside of MCM 300. For example, a first power level (e.g., 1.1V, 1.3V, 1.5V, or 1.8V) may be used for driving signals between chips, whereas a second power level (e.g., 1.8V, 2.5V, or 3.3V) may be used for driving or receiving signals with external components.

As depicted, memory chip 310 comprises a number of input/output buffers 322 along with a test buffer 324. Input/output buffers 322 permit the reading and writing of data to memory chip 310 from system chip 308. Each input/output buffer 322 can be a single-bit buffer—i.e., a buffer which supports the input or output of only a single bit of data at a given time. Test buffer 324 permits the direct testing of memory chip 310 by separately monitoring the data being read from memory chip 310 and providing this information directly to terminal 306 through traces 328, 330 when MCM 300 is placed into a memory test mode (as described herein). Test buffer 324 also can write information to memory chip 310 through input/output buffers 322, as described in further detail below.

As shown, a designated terminal 306 is bonded to a particular bonding pad 318 of system chip 308 as well as to a particular memory bonding pad 320 utilized as the test input or test output pad for test buffer 324. In one embodiment, as shown, the memory bonding pads 320 that are utilized by test buffer 324 do not connect directly to the substrate package memory bus that provides communication between memory chip 310 and system chip 308. Test buffer 324 may also be incorporated into one or more of the input/output buffers 322 such that one or more of the input/output buffers 322 also provides the test capabilities of test buffer 324 utilizing the principles of the present invention as described herein. For example, one input/output buffer 322 may incorporate test buffer 324, with an additional memory bonding pad 320 utilized to input or output test data to one or more selected terminals 306.

Due to the incorporation of test buffer 324 and its direct connections to one or more terminals 306 of MCM 300, memory chip 310 can be thoroughly tested after it has been packaged and contained inside MCM 300. In particular, during normal operation, test buffer 324 is disabled (e.g., tri-stated) so that test buffer 324 does not interfere with the signals on one or more terminals 306 that are assigned to system chip 308.

When a memory test mode is enabled, however, those same pins can be employed as test pins for memory chip 310. That is, test buffer 324 transfers information through the designated terminals 306. In one embodiment, MCM 300 will be placed into a memory test mode when a specified terminal 306 on MCM 300 is asserted or selected. The specified terminal 306 may, for example, be an assigned test pin (i.e., a no-connect (NC) pin specifically used for memory test mode entry) or an input pin by which MCM 300 can recognize a test signal once a voltage level outside the normal operating range is established. Memory chip 310 is then tested while inside MCM 300 by reassigning certain terminals 306 also used by system chip 308 as test input/output pins for memory chip 310. The reassigned pins may then be used to provide addresses, input controls, data input/output signals, and other information to properly access and test memory chip 310.

Various other alternatives are possible. For example, one or more terminals 306 may be designated as test pins to provide a test signal to place memory chip 310 into a test mode and also to provide control and/or test data signals. Alternatively, the test signal to place memory chip 310 into a test mode may be generated directly by system chip 308 without requiring a designated test pin to initiate testing. Alternatively, a specified voltage range or sequence of voltages at a certain terminal 306 may initiate testing of memory chip 310. For example, a voltage-level sensor may monitor one or more of terminals 306 designated for system chip 308 and when a predetermined voltage level is detected, testing of the memory chip 310 is initiated. Thus, one or more of the above test initiation triggers provides many options and test flexibility.

As shown in FIG. 3, MCM 300 comprises a single memory chip 310 (e.g., a single DRAM) that is designed for in-package testing. It should be understood, however, that in other embodiments, multiple memory chips designed for in-package testing might also be employed utilizing the teachings of the present invention. If a single memory chip is provided, the test data bus and memory bus system may be optimized. For example, memory chip 310 may comprise a single, high-performance, synchronous DRAM of 512 Kb by 128 bits, with a wide test data bus and memory bus subsystem (used to communicate with system chip 308) having a width greater to or equal to 128 bits.

Other configurations are possible with memory chip 310 optimized to accommodate the requirements of system chip 308. For example, memory chip 310 may be configured as a 32, 64, 128, 256 bit, or greater size, with a bus width that is equivalent or greater in size to permit high-speed transfer of data between memory chip 310 and system chip 308. These principles may be applied to embedded memory also (i.e., memory integrated with other logic on a single die). Furthermore, memory chip 310 may be manufactured, for example, using a standard commodity memory process, with the incorporation of the teachings of the present invention, while system chip 308 may be manufactured using a standard logic process or other types of processes. Thus, MCM 300 is optimized for high performance chip-to-chip interface along with complete testing capability of the internal memory.

It should be understood that the present invention is not limited by the type of chip packaging and is applicable for any type of multi-chip semiconductor packaging. As an example, MCM 300 may comprise a standard ball grid array (BGA) or thin quad flatpack (TQFP) type of package having 144 pins or more. However, many other types of packaging may be used. For example, the chip packaging may be of various types of MCMs such as having a ceramic base with chips wire bonded (e.g., MCM-C) or employing thin film substrates (e.g., MCM-D), mounted on a silicon substrate (e.g., MCM-S), or mounted on a PCB substrate (e.g., MCM-L) such as a multi-chip package (MCP). The packaging may further utilize various surface mount technologies such as a single in-line package (SIP), dual in-line package (DIP), zig-zag in-line package (ZIP), plastic leaded chip carrier (PLCC), small outline package (SOP), thin SOP (TSOP), flatpack, and quad flatpack (QFP), to name but a few, and utilizing various leads (e.g., J-lead, gull-wing lead) or BGA type connectors.

In one embodiment, during normal operation of the MCM 300, buffer 332 on system chip 308 may be supplied with the higher voltage level (e.g., Vddq=1.8V, 2.5V, or 3.3V) while input/output buffer 322 on memory chip 310 may be supplied with the lower voltage level (e.g., Vddq=1.1V, 1.3V, 1.5V, or 1.8V). In this case, having separate Vddq buses internally for input/output buffers 322 and test buffer 324 allows test buffer 324 to also be supplied with the higher voltage level (e.g., Vddq=1.8V, 2.5V, or 3.3V), which is the same power supply level as for buffer 332 on system chip 308. This eliminates or substantially reduces the possibility of a latch-up, which would be more likely to occur if test buffer 324 were supplied by the lower voltage level (e.g., Vddq=1.1V, 1.3V, 1.5V, or 1.8V) and buffer 332 were supplied by the higher voltage level (e.g., Vddq=1.8V, 2.5V, or 3.3V).

As shown in FIG. 3, in memory chip 310 one test buffer 324 is provided for every eight input/output buffers 322 to provide an eight-to-one data compression (e.g., data multiplexing) for testing purposes. By employing data compression, fewer test buffers 324 and terminals 306 are required for testing of memory chip 310. For FIG. 3, if data compression was not used, eight or more pins would be required along with one test buffer 324 for every input/output buffer 322. Thus, data compression provides more efficient use of external terminals 306 and minimizes the number of bonding pads and test buffers, along with associated circuitry, that is required to provide memory testing. Various data compression ratios may be selected, such as 2:1, 4:1, 8:1, 16:1, 32:1, 64:1, and 128:1. For example, for a 512 Kb by 128-bit memory and employing 16:1 compression, a minimum of eight test buffers and external terminal connections are required.

In some embodiments, multiple structures (e.g., buses) may be provided in MCM 300 or the chips contained therein to support the various voltage levels for power. This is because different voltage levels may be used for input/output (I/O) driving for operation and testing. For example, a first power level may be used for driving signals between chips, whereas a second power level may be used for testing of a chip. For such situations, the same I/O driving power level cannot be used for both chip-to-chip communication and testing because doing so would cause problems, such as latch-up.

With respect to MCM 300, in one embodiment for example, in memory chip 310 the first power level (which may be a lower voltage—e.g., 1.1V, 1.3V, 1.5V, or 1.8V) is used in the normal mode of operation for communicating signals to and from system chip 308, while the second power level (which may be a higher voltage—e.g., 1.8V, 2.5V, or 3.3V) is used in the test mode of operation for communicating signals to and from circuitry external to MCM 300. As such, the voltage on bonding pads 320 for input/output buffers 322 may be at the first power level, while the voltage on the bonding pads 320 for test buffer 324 may be at the second power level. MCM 300 and the chips contained therein may have circuitry and structures for supporting or translating between the various power levels, as further described herein.

Figure 4:
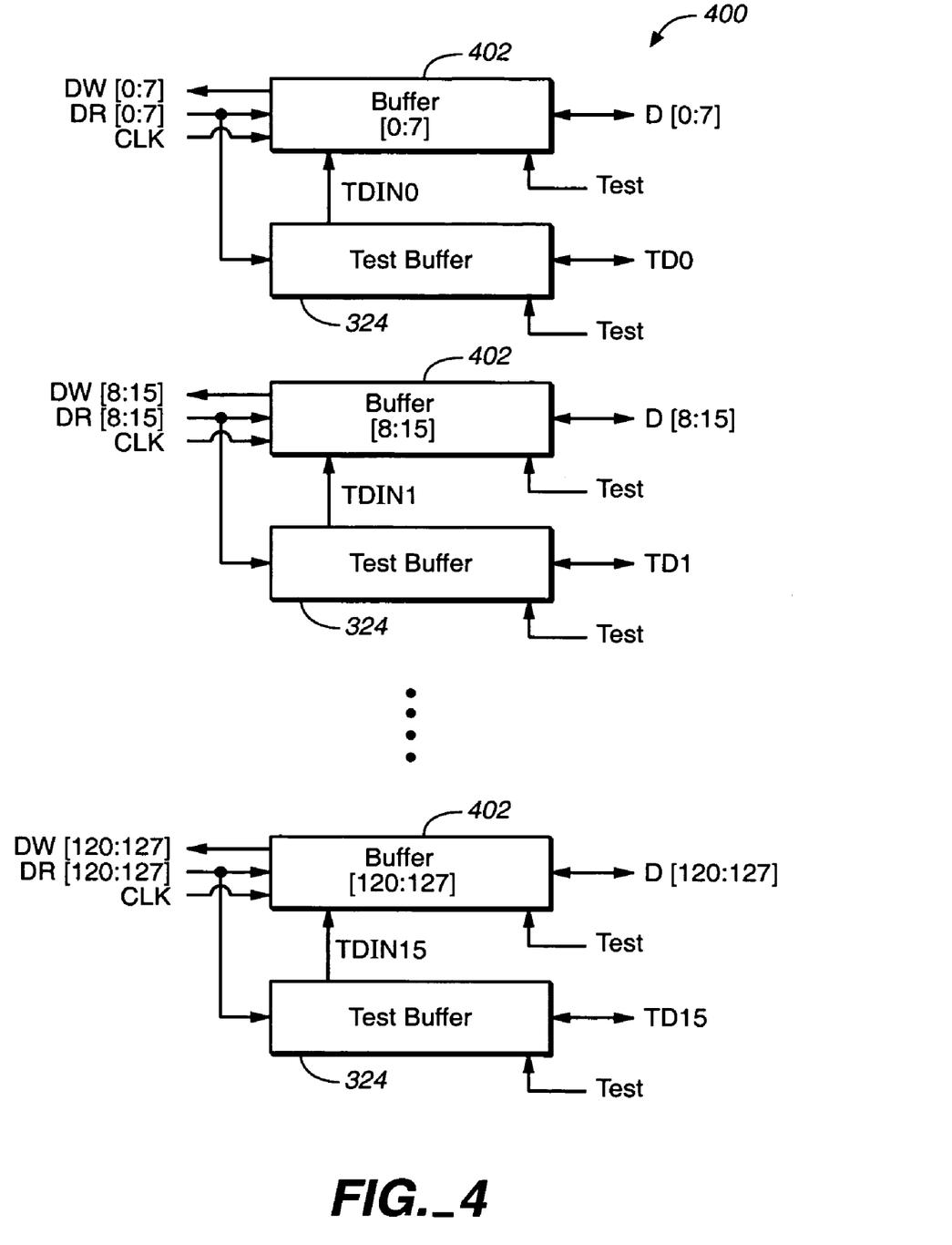
FIG. 4 is a block diagram illustrating a buffer configuration in accordance with an embodiment of the present invention.

FIG. 4 is a block diagram illustrating a buffer configuration 400 in accordance with an embodiment of the present invention. Buffer configuration 400 is an exemplary buffer configuration that can be incorporated into a memory chip (such as memory chip 310) which is part of a multi-chip semiconductor package. Buffer configuration 400 provides or supports memory test capability using standard memory test equipment while the memory chip is inside the multi-chip package.

In buffer configuration 400, an eight-to-one data compression ratio is provided for testing of an exemplary 128 bit memory chip. Buffer configuration 400 comprises 16 input/output buffers 402 and 16 test buffers 324. Each input/output buffer 402 represents eight single-bit input/output buffers. Therefore, with an 8:1 test data compression ratio, there is one test buffer 324 for every eight single-bit input/output buffers represented by input/output buffer 402.

A number of exemplary signals and data input and/or outputs are shown in FIG. 4. During test conditions, a test (Test) signal is provided to input/output buffers 402 and test buffers 324 to enable testing of the corresponding memory chip incorporating buffer configuration 400. In one embodiment, the test signal is used to place the memory chip into memory test mode. Test data input/output (TD0, TD1, . . . , TD15) signals are provided to respective test buffers 324. Test input data (TDIN0, TDIN1, . . . , TDIN15) signals are provided from corresponding test buffers 324 to respective input/output buffers 402 to communicate or convey, for example, test patterns designed to test the operation of the memory chip. Data read (DR) signals are provided to input/output buffers 402 and respective test buffers 324 to communicate or convey data which is read from the memory chip for purposes of testing. Data write (DW) signals are provided from input/output buffers 402 to communicate or convey data which is written into the memory chip for the purposes of testing.

During normal operation (i.e., non-test conditions), input/output buffers 402 transfer data between the system chip through corresponding data (DR/DW) signals. Input/output buffers 402 obtain data from the memory chip through data read (DR) signals and write to the memory chip through data write (DW) signals. A clock (CLK) signal may be provided, if required, to synchronize the various buffer and data transfer operations.

In one embodiment, the test data input/output (TD0, TD1, ..., TD15) signals may be at a higher power level (e.g., 1.8V, 2.5V, or 3.3V) while the other signals may be at the lower or core power level (e.g., 1.1V, 1.3V, 1.5V, or 1.8V). Input/output buffers 402 and test buffers 324 have circuitry and structures for handling or translating between these various power levels.

Figure 11:
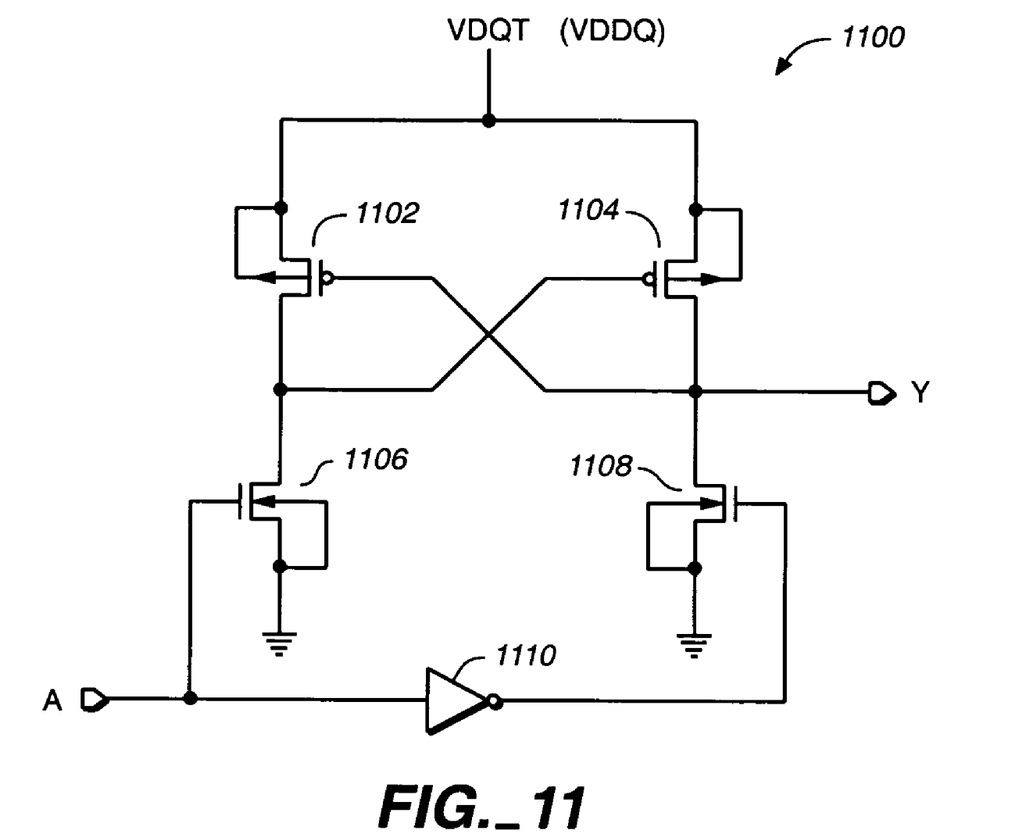
FIG. 11 is a schematic diagram for a level translator circuit in accordance with an embodiment of the present invention.

An example of such a circuit is shown in FIG. 11. Referring now to FIG. 11, a level translator circuit 1100 may convert a signal at one power level to another power level. As depicted, level translator circuit 1100 comprises p-type transistors 1102, 1104, n-type transistors 1106, 1108, and an inverter gate 1110. Each of transistors 1102, 1104, 1106, and 1108 are back-gate biased. A voltage source at one power level (either the high or low power level) is connected to the level translator circuit 1100. At an input node A, level translator circuit 1100 may receive signals at the other power level. In operation, the signals at one power level which are received at input node A are translated into the other power level and output at an output node Y. One or more level translator circuits 1100 may be incorporated and used throughout memory chip 310 or system chip 308 for translating between power levels (either from higher power level to lower power level, or vice versa).

Figure 5:
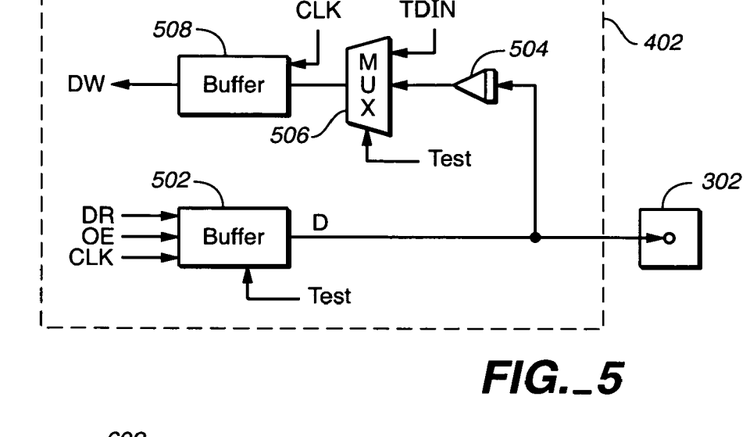
FIG. 5 is a schematic diagram, in partial block form, for an input/output buffer in accordance with an embodiment of the present invention.

FIG. 5 is an exemplary schematic diagram, in partial block form, for an input/output buffer 402 in accordance with an embodiment of the present invention. As shown, input/output buffer 402 comprises an output buffer 502, an input buffer 504, a multiplexer 506, and a buffer 508. Output buffer 502 receives data read (DR) signals from the corresponding memory chip and prepares or temporarily stores the data prior to output through connections at memory bonding pad 320. Various signals are associated with output buffer 502 including test (Test) signal, data read (DR)/data write (DW) signals, and clock (CLK) as discussed above. An output enable (OE) signal may also be provided for timing and initiation of data transfer.

Data being written to input/output buffer 402 passes through connections at memory bonding pad 320 and is received by input buffer 504. Multiplexer 506 receives the data (D) from input buffer 504 and/or test input data (TDIN) signals, (as controlled by the test signal), and transfers the data to buffer 508, which may receive a clock (CLK) signal for synchronization. Buffer 508 then transfers to memory the data to be written via data write (DW) signal.

Figure 6A:
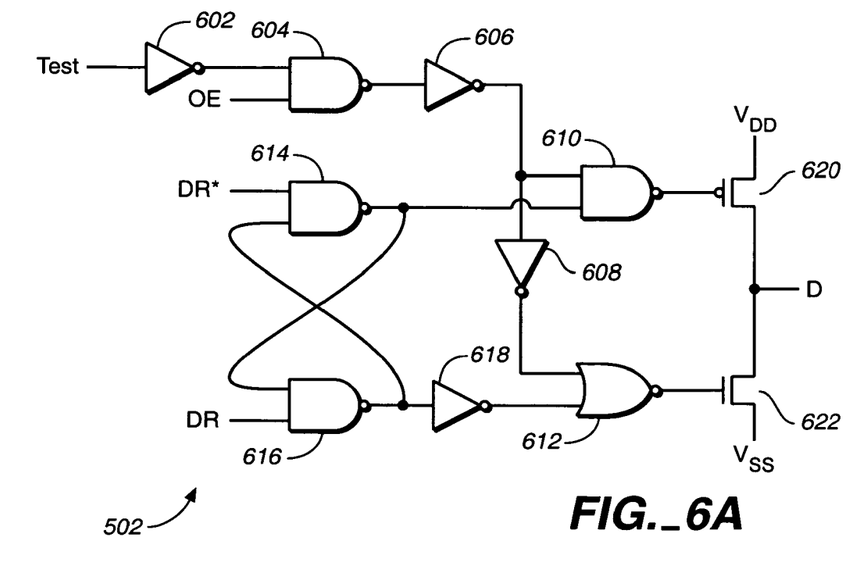
FIGS. 6A and 6B are schematic diagrams for implementations of an output buffer in accordance with an embodiment of the present invention.

FIG. 6A is a schematic diagram for one implementation of output buffer 502 in accordance with an embodiment of the present invention. As shown, output buffer 502 comprises inverters 602, 606, 608, and 618, NAND gates 604, 610, 614, and 616, NOR gate 612, along with p-type and n-type transistors 620, 622, respectively. Output buffer 502 receives test (Test) signal, output enable (OE) signal, data read (DR) signal and its complement (DR*) signal, and may also receive a clock signal (not shown) for synchronization. Output buffer 502 functions to provide the data to the memory bus when a memory read operation is performed. When the memory chip is being tested and receives the test signal, output buffer 502 inhibits the output of the data (D) so as to not interfere with memory testing being performed.

As an example of circuit operation, test signal is inverted by inverter 602 and received by NAND gate 604 along with output enable (OE) signal. If the test signal is at a "logic high" signal level, the memory chip is placed in memory test mode. NAND gate 604 outputs a "logic high" signal level, which is inverted by inverter 606 into a "logic low" signal level. This results in NAND gate 610 providing a "logic high" signal level that turns transistor 620 off. The "logic low" signal level from inverter 606 is inverted by inverter 608 into a "logic high" signal level. This results in NOR gate 612 providing a "logic low" signal level to transistor 622. Accordingly, transistor 622 switches off so that no data (D) passes through output buffer 502.

If the test signal is at a "logic low" signal level, the memory chip is in normal operation (i.e., no initiation of memory testing). If output enable (OE) signal is at a "logic high" signal level, then NAND gate 604 supplies a "logic low" signal level, which results in NAND gate 610 receiving a "logic high" signal level and NOR gate 612 receiving a "logic low" signal level. This allows the value of the data (DR and DR*) to determine whether to switch on or off transistors 620 and 622, thus allowing them to function as an output driver circuit. Accordingly, data is permitted to be transferred through output buffer 502. Thus, inverters 602, 606, and 608 along with NAND gate 610 and NOR gate 612 implement tri-state circuitry that is utilized to enable or disable output buffer 502.

NAND gates 614, 616, which are cross-coupled together to function as latches, receive data signals DR, DR*. If DR is at a "logic high" signal level, NAND gate 616 provides a "logic low" signal level, which gets inverted by inverter 618, while NAND gate 614 provides a "logic high" signal level. Consequently, NOR gate 612 receives a "logic high" signal level, which results in transistor 622 being switched off. NAND gate 610 receives a "logic high" signal level from inverter 606 and NAND gate 614, which results in transistor 620 being switched on. Thus, a "logic high" signal level is provided as an output data signal when DR is at a "logic high" signal level. Similarly, if DR is at a "logic low" signal level, transistor 620 is switched off and transistor 622 is switched on to provide a "logic low" signal level as an output data signal.

Figure 6B:
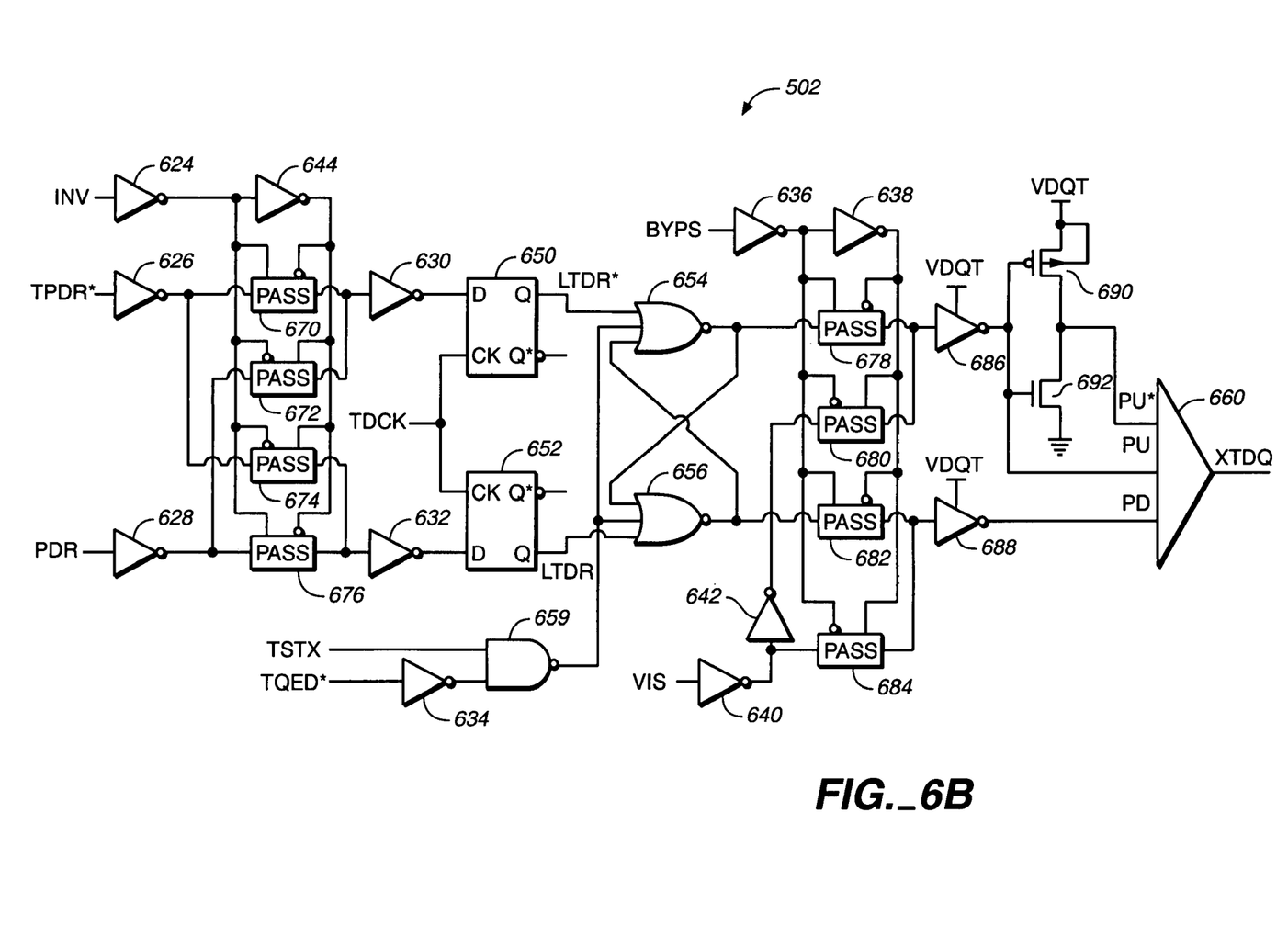

FIG. 6B is a schematic diagram for another implementation of output buffer 502 in accordance with an embodiment of the present invention. This implementation depicted in FIG. 6B is similar in many respects to the implementation depicted in FIG. 6A. As depicted, output buffer 502 comprises inverters 624, 626, 628, 630, 632, 634, 636, 638, 640, 642, and 644, DQ flip-flops 650 and 652, NOR gates 654 and 656, NAND gate 658, multiplexer 660, pass gate circuits 670, 672, 674, 676, 678, 680, 682, and 684, level translator circuits 686 and 688, p-type transistor 690, and n-type transistor 692.

Level translator circuits 686 and 688 function to translate signals from one power level (e.g., 1.1V, 1.3V, 1.5V, or 1.8V) to another power level (e.g., 1.8V, 2.5V, or 3.3V) between input and output of the buffer 502. An exemplary implementation for a level translator circuit is shown and described with reference to FIG. 11.

Each pass gate circuit 670, 672, 674, 676, 678, 680, 682, and 684 generally functions to pass the value of a signal appearing at its input as the value of its output signal upon a particular value for some "pass" signal (which, as shown, can be an INV signal or a BYPS signal). An exemplary implementation of a pass gate circuit is described in related U.S. application Ser. No. 09/967,389 entitled "Testing of Integrated Circuit Devices," filed on Sep. 28, 2001, to be issued as U.S. Pat. No. 6,754,866 on Jun. 22, 2004, assigned to the same assignee and incorporated by reference herein in its entirety.

Figure 7:
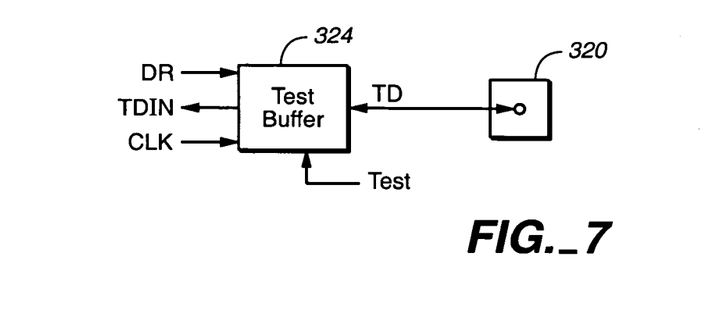
FIG. 7 is a block diagram illustrating a test buffer in 25 accordance with an embodiment of the present invention.

FIG. 7 is a block diagram illustrating an exemplary test buffer 324 in accordance with an embodiment of the present invention. Test buffer 324 may be incorporated into a memory chip that is incorporated into a multi-chip-semiconductor package to provide memory test capability using standard memory test equipment. Test buffer 324 utilizes one or more bonding pads 320 to transfer information, via test data input/output (TD) signal, through external connections of multi-chip module 300. Test data input/output (TD) signal may convey or communicate test data, memory addresses, control signals, and various other information required to test the memory chip. Test buffer 324 also receives test (Test) signal, which enables testing of the corresponding memory chip, along with the data read (DR) signals that are utilized during memory testing. A clock (CLK) signal may also be provided, if required to synchronize the operations or provide other clocking functions. Test input data (TDIN) signals are provided by the test buffer 324 to the respective input/output buffers of the memory chip in order to write various test data into the memory chip to ensure correct operation.

Figure 8:
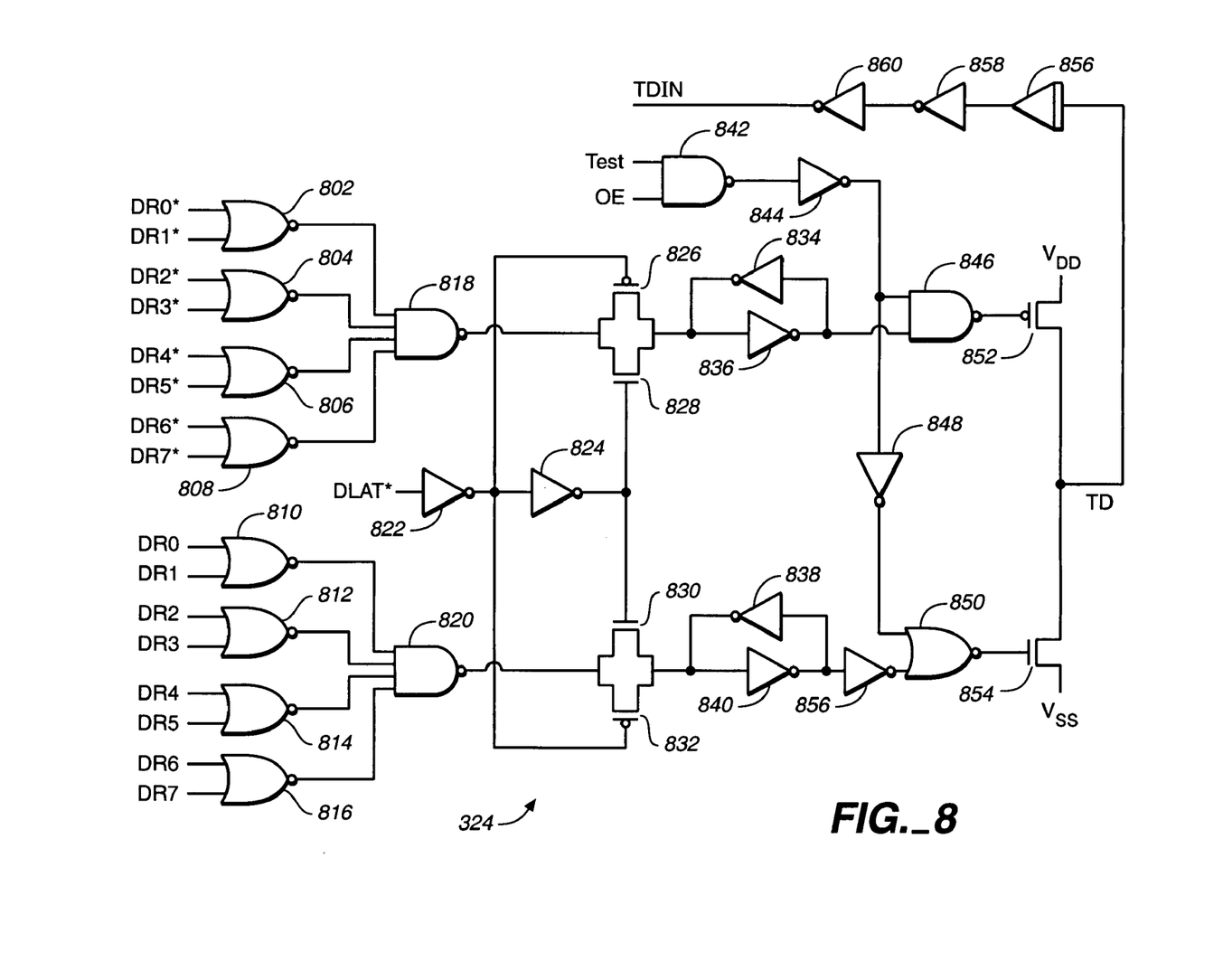
FIG. 8 is a schematic diagram for a test buffer in accordance with an embodiment of the present invention.

FIG. 8 is an exemplary schematic diagram for a test buffer 324 in accordance with an embodiment of the present invention. Test buffer 324 comprises a number of NOR gates 810, 812, 814, and 816 that receive data read (DR0–DR7) signals and output the logical result to NAND gate 820. Similarly, NOR gates 802, 804, 806, and 808 receive complements of the data read (DR0*–DR7*) signals and output the logical result to NAND gate 818. NAND gates 818, 820 output their result to transistors 826, 828 and transistors 830, 832, respectively. Transistor 826, 828 and transistors 830, 832 function as pass gates controlled by the complement of a data latch signal (DLAT*) in conjunction with inverters 822, 824. The pass gates provide the signals output by NAND gates 818 and 820 to pairs of inverters 834, 836 and 838, 840. These inverter pairs function as data latches. The output of the latch formed by inverters 834, 836 is fed to a NAND gate 846, while the output of the latch formed by inverters 838, 840 is inverted by an inverter 856 and fed to a NOR gate 850. The output signal of NAND gate 846 controls a p-type transistor 856, and the output signal of NAND gate 850 controls an n-type transistor 854. Transistors 852, 854 form an output driver circuit to provide the output for test data (TD) input/output signal.

Input buffer 856 and inverters 858, 860 receive externally provided test data signals and provide this data to respective input/output buffers of the memory chip, as described above. A NAND gate 842, inverters 844, 848, NAND gate 846, and NOR gate 850 implement the tri-state circuitry that is utilized to enable or disable test buffer 324. For example, if test signal and OE signal are not both at a "logic high" signal level, NAND gate 842 provides a "logic high" signal level, which is inverted to a "logic low" signal level by inverter 844. A "logic low" signal level at NAND gate 846 results in a "logic high" signal level output, which switches transistor 852 off. Inverter 848 inverts the "logic low" signal level from inverter 844, which results in NOR gate 850 producing a "logic low" signal level that switches transistor 854 off also. Thus, test buffer 324 does not produce an output that would interfere with other memory functions when the memory chip is in normal operation.

The following is an example of the operation of test buffer 324 when test and output enable (OE) signals are both at a "logic high" signal level. If data read (DR) signals are all at a "logic low" signal level, the outputs of NAND gates 820, 818 are at a "logic low" and "logic high" signal level, respectively. This results in NOR gate 850 and NAND gate 846 generating "logic high" signal levels, which switches on transistor 854 and switches off transistor 852 to output a "logic low" TD signal level. If data read (DR) signals are all at a "logic high" signal level, the outputs of NAND gates 820, 818 are at a "logic high" and "logic low" signal levels, respectively. This results in NOR gate 850 and NAND gate 846 generating "logic low" signal levels, which switches transistors 852, 854 on and off, respectively, to output a "logic high" signal level for TD signal.

Figure 9:
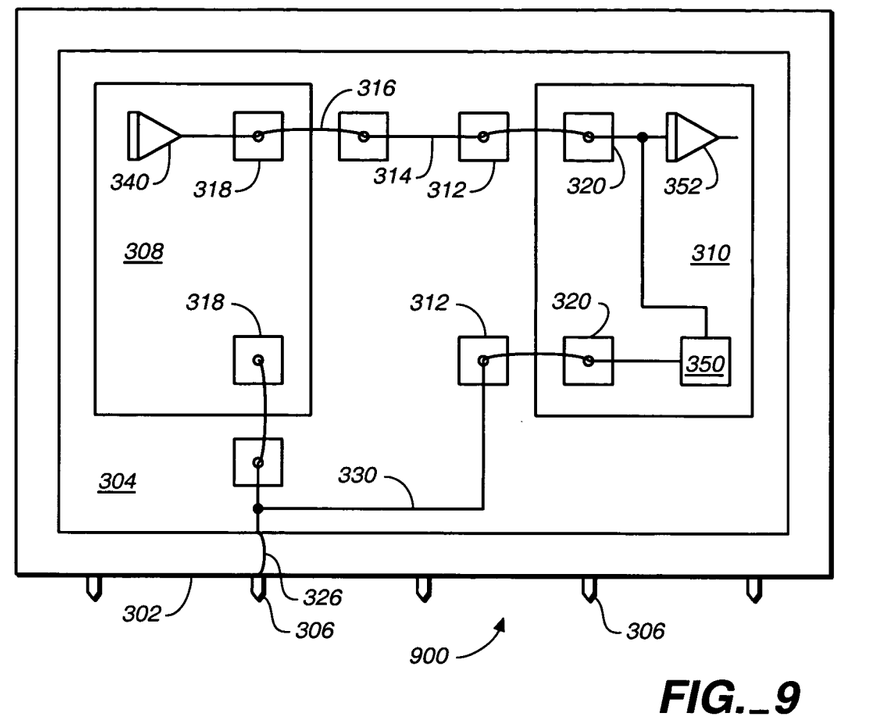
FIG. 9 is a block diagram illustrating a multi-chip module in accordance with an embodiment of the present invention.

FIG. 9 is a block diagram illustrating a multi-chip module (MCM) 900 in accordance with an embodiment of the present invention. MCM 900 illustrates a system and method of providing control signals to a secondary chip such as memory chip 310 that typically would not have direct access to external pins or connectors such as terminals 306. MCM 900 comprises similar elements as MCM 300, described in detail in reference to FIG. 3, and therefore the description for the common elements will not be repeated here. Furthermore, the various unique elements of MCM 900, which were not shown in MCM 300, may be incorporated into MCM 300 or work in conjunction with elements of MCM 300, as described in further detail below.

MCM 900 comprises system chip 308 and memory chip 310. System chip 308 comprises an output buffer 340 that provides control or logic signals such as, for example, address decode signals. These signals may be communicated through the connections shown to an input buffer 352 that receives these signals and provides them to memory chip 310, which takes the appropriate action based on the control or logic signals. For example, memory chip 310 may provide data that is stored in certain memory locations identified by the control or logic signals.

Memory chip 310 further comprises a test buffer driver 350 that can receive control or logic signals through one or more terminals 306. Test buffer driver 350 may share these terminals 306 with system chip 308 (as shown in FIG. 9) or may utilize certain of terminals 306 that are dedicated for test purposes, as similarly explained in detail above for test buffer 324. Test buffer driver 350 receives these control or logic signals from external test equipment through terminals 306 and provides these signals to input buffer 352 of memory chip 310. Consequently, memory chip 310 can be controlled either by system chip 308 or by test buffer driver 350.

Figure 10:
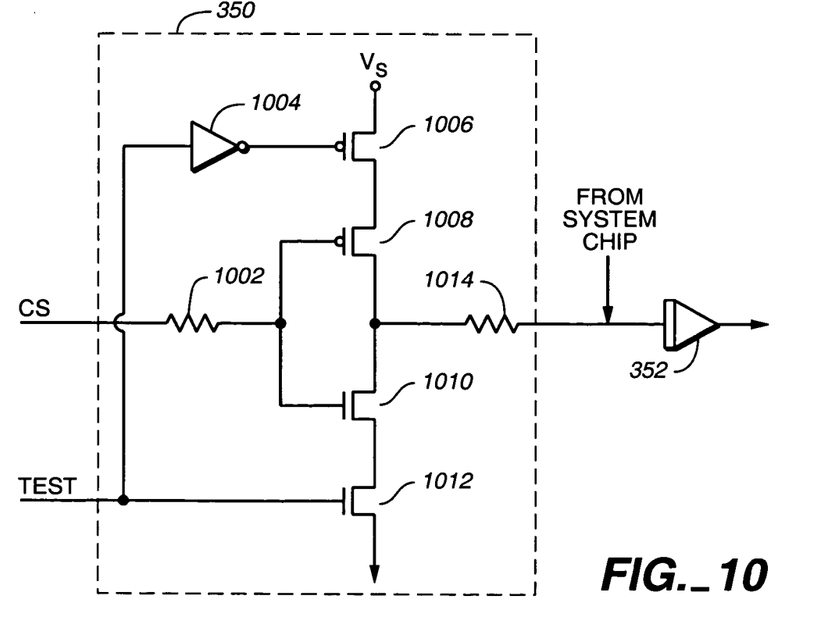
FIG. 10 is a schematic diagram for a test buffer driver in accordance with an embodiment of the present invention.

FIG. 10 is a schematic diagram for test buffer driver 350 in accordance with an embodiment of the present invention. Test buffer driver 350 may be incorporated into test buffer 324, but multiplexing of signals or similar methods would be required if the same input/output terminals 306 are utilized for control or logic signals along with data input and output signals. Alternatively, one or more separate terminals 306 may be assigned for control and logic signals (e.g., command and control type signals such as addressing information) and other terminals 306 for data input and output signals (e.g., test data).

As is illustrated in FIG. 9, the output of test buffer driver 350 is connected to input buffer 352 of memory chip 310, with this connection shared by system chip 308. In normal operation (i.e., non-test conditions), system chip 308 may use this connection to provide control signals to memory chip 310 through input buffer 352. However, during memory test conditions, this connection is used by test buffer driver 350 to provide control signals to memory chip 310 through input buffer 352. Furthermore, input buffer 352 may be incorporated into input/output buffer 322 of memory chip 310.

Referring to FIG. 10, test buffer driver 350 comprises resistors 1002 and 1014, inverter 1004, p-type transistors 1006 and 1008, and n-type transistors 1010 and 1012. Resistors 1002 and 1014 provide input protection and isolation for test buffer driver 350. In operation, if Test signal is at a "logic low" signal level, transistors 1006 and 1012 are switched off and test buffer driver 350 does not provide any output or control signal to input buffer 352, and thus does not affect circuit operation of memory chip 310. If Test signal is at a "logic high" signal level, then transistors 1006 and 1012 are switched on. This allows control signals (CS) to be driven by transistors 1008 and 1010 to input buffer 352 of memory chip 310. An inverter may be included at the input to test buffer driver 350 so that when control signals are at a "logic low" or "logic high" level, then the output of test buffer driver 350 are also at a "logic low" or "logic high" level, respectively.

It should be understood that the present invention provides many advantages over conventional multi-chip packaged semiconductor devices by providing the ability to stringently test the secondary chip (e.g., memory chip) inside the package using standard integrated circuit test equipment (e.g., memory test equipment). Furthermore, the ability to stringently test the secondary chips provides many advantages. For example, one or more memory chips may be provided having a wide data input/output configuration that is optimally tailored to the system data bus architecture within the package.

It should also be understood that the present invention is not limited to the testing of memory chips within a multi-chip package. One or more exemplary embodiments described above utilized one or more memory chips as the exemplary secondary chips, but the present invention is not limited to these embodiments. The principles of the present invention are applicable to other types of secondary chips such as co-processors, analog chips, or various types of application specific chips or subsystems that interface through primary chips or fail to interface directly through external connectors of the multi-chip package.

Furthermore, depending on the type of primary and/or secondary chip, one or more devices such as, for example, signal drivers (i.e., current or voltage signal drivers), may replace the data buffers and/or test buffers. For example, the primary chip may comprise an ASIC and the secondary chip may comprise a co-processor, with control signals and data passing between the interface of the primary and secondary chip through signal drivers that may be accompanied by or include buffers or registers. The signal drivers or interface may comprise, for example, transistor-to-transistor logic (TTL), low-voltage TTL (LVTTL), or stub series terminated logic (SSTL) interface technology.

Embodiments described above illustrate but do not limit the invention. It should also be understood that numerous modifications and variations are possible in accordance with the principles of the present invention. Accordingly, the scope of the invention is defined only by the following claims.

I claim:

1. A semiconductor memory chip for packaging along with a system chip in a single semiconductor package having a plurality of external connectors, the memory chip comprising:
   a memory storage array for storing data;
   a plurality of data buffers for writing or reading data between said memory storage array and the system chip within the single semiconductor package, wherein a first power level is used for each of the plurality of data buffers; and
   at least one test buffer directly connected to certain of said plurality of external connectors for supporting testing of said memory chip within the single semiconductor package by external test equipment, wherein a second power level is used for the test buffer.

2. The memory chip of claim 1 wherein said memory chip comprises at least one of a random access memory (RAM), a static RAM, a dynamic RAM, a non-volatile RAM, a read only memory (ROM), a programmable ROM, an erasable programmable ROM, an electrically erasable programmable ROM, and a flash memory.

3. The memory chip of claim 1 wherein said at least one test buffer provides data compression.

4. The memory chip of claim 1 wherein said at least one test buffer is disabled during a normal mode of operation and enabled during a test mode of operation, wherein said at least one test buffer provides said memory chip with signals for at least one of addresses, control, and data input.

5. The memory chip of claim 1 wherein said at least one test buffer communicates with external memory test equipment through the certain of said plurality of external connectors to test said memory chip.

6. The memory chip of claim 1 wherein at least one of said plurality of data buffers incorporates said at least one test buffer.

7. The memory chip of claim 1 wherein:
   the first power level is one of 1.1V, 1.3V, 1.5V, and 1.8V; and
   the second power level is one of 1.8V, 2.5V, and 3.3V.

8. The memory chip of claim 1 wherein the first power level is higher than the second power level.

9. The memory chip of claim 1 wherein the first power level is lower than the second power level.

10. A packaged semiconductor device comprising:
    a plurality of external connectors for a semiconductor package;
    a primary chip disposed within the semiconductor package and connected to at least a portion of said plurality of external connectors; and
    a secondary chip disposed within the semiconductor package and connected to said primary chip, said secondary chip comprising:
       a plurality of data signal drivers for transferring information between said secondary chip and said primary chip during a normal mode of operation, wherein a first power level is used for each of the plurality of data signal drivers; and
       at least one test signal driver directly connected to certain of said portion of said plurality of external connectors to provide testing of said secondary chip during a test mode of operation and while contained within the semiconductor package, wherein a second power level is used for the test signal driver.

11. The packaged semiconductor device of claim 10 wherein said secondary chip comprises at least one of a memory chip, a co-processor chip, an analog subsystem, and an application-specific subsystem.

12. The packaged semiconductor device of claim 10 wherein said primary chip comprises at least one of a processor, a microcontroller, a microprocessor, a field programmable gate array, and an application specific integrated circuit (ASIC).

13. The packaged semiconductor device of claim 10 wherein said at least one test signal driver is operable to compress data.

14. The packaged semiconductor device of claim 10 wherein said at least one test signal driver is disabled during the normal mode of operation and enabled during the test mode of operation.

15. The packaged semiconductor device of claim 10 wherein said at least one test signal driver communicates with external test equipment through said certain of said portion of said plurality of external connectors.

16. The packaged semiconductor device of claim 10 wherein:
the first power level is one of 1.1V, 1.3V, 1.5V, and 1.8V; and
the second power level is one of 1.8V, 2.5V, and 3.3V.

17. The packaged semiconductor device of claim 10 wherein the first power level is higher than the second power level.

18. The packaged semiconductor device of claim 10 wherein the first power level is lower than the second power level.

19. A semiconductor chip for incorporation as a secondary chip into a multi-chip packaged semiconductor device, the semiconductor chip comprising:
at least one data buffer operable to connect to a primary chip incorporated into the multi-chip packaged semiconductor device for receiving from and outputting signals to the primary chip during a normal mode of operation, wherein a first power level is used for each of the plurality of data buffers; and
a test buffer operable to directly connect to an external terminal of the multi-chip packaged semiconductor device for receiving from and outputting signals to external testing circuitry during a test mode of operation, wherein a second power level is used for the test buffer.

20. The semiconductor chip of claim 19 wherein during the test mode of operation, the at least one data buffer is tri-stated and the test buffer is enabled to provide testing for the semiconductor chip.

21. The semiconductor chip of claim 19 wherein during the normal mode of operation, the at least one data buffer is enabled and the test buffer is tri-stated.

22. The semiconductor chip of claim 19 wherein:
the first power level is one of 1.1V, 1.3V, 1.5V, and 1.8V; and
the second power level is one of 1.8V, 2.5V, and 3.3V.

23. The semiconductor chip of claim 19 wherein the first power level is higher than the second power level.

24. The semiconductor chip of claim 19 wherein the first power level is lower than the second power level.

* * * * *